United States Patent
Peng

(10) Patent No.: US 11,087,848 B1
(45) Date of Patent: Aug. 10, 2021

(54) DATA ARRANGING METHOD, MEMORY CONTROL CIRCUIT UNIT AND MEMORY STORAGE DEVICE FOR FLASH MEMORY FOR IMPROVING THE PERFORMANCE OF VALID DATA MERGING OPERATION

(71) Applicant: Hefei Core Storage Electronic Limited, Anhui Province (CN)

(72) Inventor: Chong Peng, Anhui Province (CN)

(73) Assignee: Hefei Core Storage Electronic Limited, Anhui Province (CN)

( * ) Notice: Subject to any disclaimer, the term of this patent is extended or adjusted under 35 U.S.C. 154(b) by 0 days.

(21) Appl. No.: 16/812,373

(22) Filed: Mar. 9, 2020

(30) Foreign Application Priority Data

Jan. 21, 2020 (CN) .......................... 202010070040.9

(51) Int. Cl.
*G11C 16/14* (2006.01)
*G11C 16/34* (2006.01)
*G06F 12/02* (2006.01)

(52) U.S. Cl.
CPC .......... *G11C 16/14* (2013.01); *G06F 12/0246* (2013.01); *G11C 16/344* (2013.01); *G11C 16/349* (2013.01); *G11C 16/3468* (2013.01); *G06F 2212/7209* (2013.01)

(58) Field of Classification Search
CPC ... G11C 16/14; G11C 16/3468; G11C 16/344; G11C 16/349; G06F 12/0246; G06F 2212/7209; G06F 3/061; G06F 3/0652
See application file for complete search history.

(56) References Cited

U.S. PATENT DOCUMENTS 10,310,739 B2 * 6/2019 Chen ....................... G06F 3/061
2017/0206006 A1 * 7/2017 Liao ..................... G06F 11/1044

* cited by examiner

*Primary Examiner* — David Lam
(74) *Attorney, Agent, or Firm* — JCIPRNET

(57) ABSTRACT

A data arranging method, a memory control circuit unit and a memory storage device for flash memory are provided. The method can be applied to a flash memory with a three-dimensional (3D) structure, an embedded memory device, or a solid-state hard disk. The method includes: writing at least one piece of data to at least one second physical erasing unit of at least one first physical erasing unit, and obtaining a distribution state of valid data in a plurality of physical erasing units; adjusting a specific threshold value according to the distribution state; and when the number of the at least one first physical erasing unit is less than the specific threshold value, performing a valid data merging operation.

18 Claims, 9 Drawing Sheets

DATA ARRANGING METHOD, MEMORY CONTROL CIRCUIT UNIT AND MEMORY STORAGE DEVICE FOR FLASH MEMORY FOR IMPROVING THE PERFORMANCE OF VALID DATA MERGING OPERATION

CROSS-REFERENCE TO RELATED APPLICATION

This application claims the priority benefit of China application no. 202010070040.9, filed on Jan. 21, 2020. The entirety of the above-mentioned patent application is hereby incorporated by reference herein and made a part of this specification.

BACKGROUND

Technical Field

The disclosure relates to a data arranging method, a memory control circuit unit and a memory storage device for flash memory.

Description of Related Art

As digital cameras, mobile phones and MP3 players have grown rapidly in recent years, the consumers' demand for storage media has also increased rapidly. Since a rewritable non-volatile memory module (e.g. a flash memory) has the characteristics of data non-volatility, power saving, small size, and having no mechanical structure, it is very suitable for being built in a variety of portable multimedia devices as exemplified above.

In general, a rewritable non-volatile memory module has a plurality of physical erasing units, and the memory management circuit is logically divided into a plurality of areas. These areas typically include a data area and an idle area. When a write command and data to be written are received from the host system, the memory management circuit gets the physical erasing units from the idle area and writes the data to the gotten physical erasing units to replace the physical erasing units in the data area. When the number of idle physical erasing units in the idle area of the rewritable non-volatile memory module is not greater than a specific threshold value, the memory management circuit performs a VDMO. For example, the memory management circuit selects a plurality of physical erasing units (also referred to as source physical erasing units) with the least valid data from the data area, and copies the valid data from the source physical erasing units to at least one physical erasing unit (also referred to as a destination physical erasing unit) in the idle area. Then, the memory management circuit performs an erasing operation on the source physical erasing units and re-associates the source physical erasing units with the idle area to increase the number of physical erasing units in the idle area. In addition, the memory management circuit also associates the destination physical erasing units with the data area.

However, depending on the different distributions of the valid data in the rewritable non-volatile memory module, there may be different execution efficiency when performing the VDMO. In an example, it is assumed that there are five source physical erasing units, and after these five source physical erasing units are used to perform the VDMO, only one physical erasing unit is added to the idle area. In another example, it is assumed that there are two source physical erasing units, and after these two source physical erasing units are used to perform the VDMO, only one physical erasing unit is added to the idle area. Compared with the first example, in the second example, fewer physical erasing units have to be accessed when the VDMO is performed, so the second example has better execution efficiency. In particular, when the execution efficiency of the VDMO is poor, it will consequently affect the write performance of the host system to the rewritable non-volatile memory module.

Therefore, how to prevent the VDMO from affecting the write performance of the host system to the rewritable non-volatile memory module is one of the problems that persons skilled in the art intend to solve.

SUMMARY

The disclosure provides a data arranging method, a memory control circuit unit and a memory storage device for flash memory, which can prevent the VDMO from affecting the write performance of the host system to the rewritable non-volatile memory module.

The disclosure provides a data arranging method for flash memory, configured for a rewritable non-volatile memory module, wherein the rewritable non-volatile memory module has a plurality of physical erasing units, the rewritable non-volatile memory module includes an idle area, and at least one first physical erasing unit of the plurality of physical erasing units is associated with the idle area, the data arranging method including: writing at least one piece of data into at least one second physical erasing unit of the first physical erasing unit; obtaining a distribution state of valid data in the plurality of physical erasing units; adjusting a specific threshold value according to the distribution state; and when the number of the first physical erasing unit is less than the specific threshold value, performing a VDMO.

The disclosure provides a memory control circuit unit for flash memory, configured to control a rewritable non-volatile memory module, the memory control circuit unit including a host interface, a memory interface and a memory management circuit. The host interface is configured to be coupled to a host system. The memory interface is configured to be coupled to the rewritable non-volatile memory module, wherein the rewritable non-volatile memory module has a plurality of physical erasing units, the rewritable non-volatile memory module includes an idle area, and at least one first physical erasing unit of the plurality of physical erasing units is associated with the idle area. The memory management circuit is coupled to the host interface and the memory interface and is configured to perform the following operations: to write at least one piece of data into at least one second physical erasing unit of the first physical erasing unit; to obtain a distribution state of valid data in the plurality of physical erasing units; to adjust a specific threshold value according to the distribution state; and when the number of the first physical erasing unit is less than the specific threshold value, to perform a VDMO.

The disclosure provides a memory storage device for flash memory, including a connection interface unit, a rewritable non-volatile memory module, and a memory control circuit unit. The connection interface unit is configured to be coupled to a host system. The rewritable non-volatile memory module has a plurality of physical erasing units, and the rewritable non-volatile memory module includes an idle area, and at least one first physical erasing unit of the plurality of physical erasing units is associated with the idle area. The memory control circuit unit is coupled to the connection interface unit and the rewritable non-volatile memory module and is configured to perform the following operations: to write at least one piece of data into at least one second physical erasing unit of the first physical erasing unit; to obtain a distribution state of valid data in the plurality of physical erasing units; to adjust a specific threshold value according to the distribution state, and when the number of the first physical erasing unit is less than the specific threshold value, to perform a VDMO.

Based on the above, the data arranging method, the memory control circuit unit, and the memory storage device for flash memory of the disclosure can dynamically adjust the specific threshold value for determining whether to perform the VDMO according to the distribution state of the valid data in the rewritable non-volatile memory module, thereby preventing the VDMO from affecting the write performance of the host system to the rewritable non-volatile memory module and thereby improving the performance of the VDMO.

DESCRIPTION OF THE EMBODIMENTS

In general, a memory storage device (also referred to as a memory storage system or a memory storage device for flash memory) includes a rewritable non-volatile memory module and a controller (also referred to as a control circuit). Typically, the memory storage device is used together with a host system to enable the host system to write data to or read data from the memory storage device.

Figure 1:
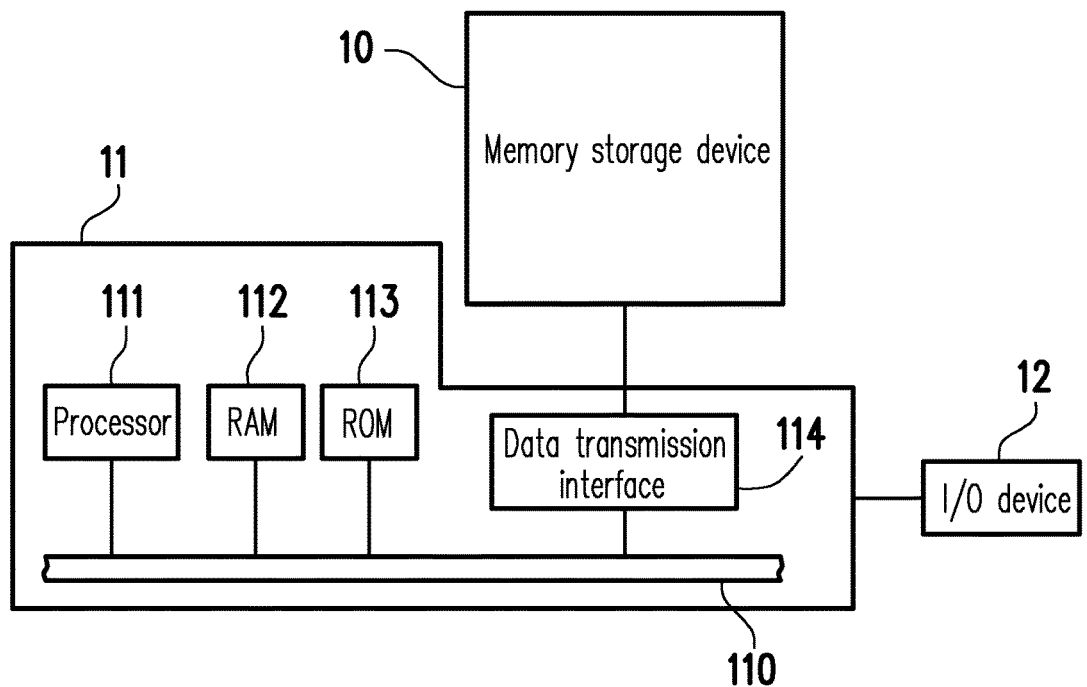
FIG. 1 is a schematic diagram of a host system, a memory storage device, and an input/output (I/O) device according to an exemplary embodiment of the disclosure.
Figure 2:
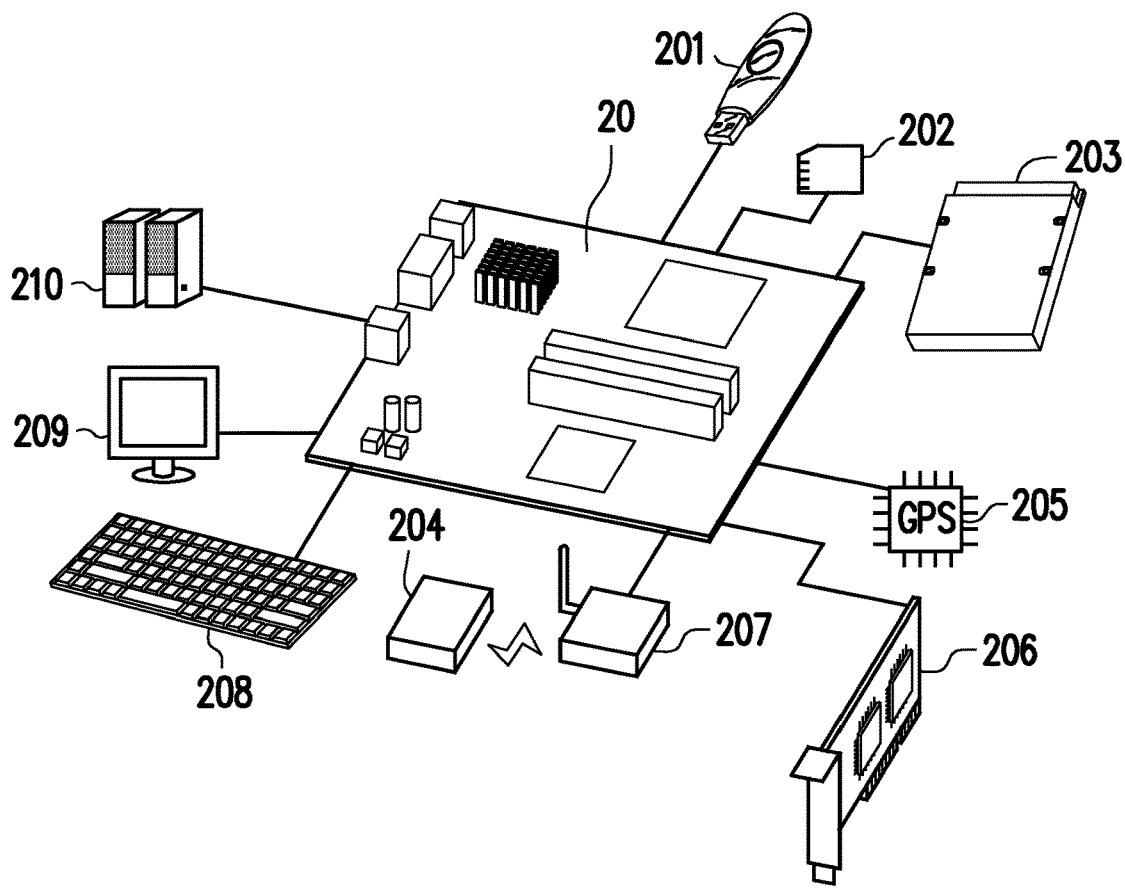
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to another exemplary embodiment of the disclosure.

With reference to FIGS. 1 and 2, a host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the present exemplary embodiment, the host system 11 is coupled to a memory storage device 10 via the data transmission interface 114. For example, the host system 11 may store data to or read data from the memory storage device 10 via the data transmission interface 114. In addition, the host system 11 is coupled to an I/O device 12 via the system bus 110. For example, the host system 11 may transmit output signals to or receive input signals from the I/O device 12 via the system bus 110.

In the present exemplary embodiment, the processor 111, the random access memory 112, the read only memory 113, and the data transmission interface 114 may be disposed on a motherboard 20 of the host system 11. The number of the data transmission interface 114 may be one or a plurality. The motherboard 20 may be coupled to the memory storage device 10 via the data transmission interface 114 through a wired or wireless connection. The memory storage device 10 may be, for example, a flash drive 201, a memory card 202, a solid state drive (SSD) 203, or a wireless memory storage device 204. The wireless memory storage device 204 may be a memory storage device based on various wireless communication technologies, such as a near field communication (NFC) memory storage device, a wireless fax (WiFi) memory storage device, a Bluetooth memory storage device, a low power Bluetooth memory storage device (e.g. iBeacon), etc. In addition, the motherboard 20 may also be coupled to various I/O devices, such as a global positioning system (GPS) module 205, a network interface card 206, a wireless transmission device 207, a keyboard 208, a screen 209, a speaker 210, etc., via the system bus 110. For example, in an exemplary embodiment, the motherboard 20 may access the wireless memory storage device 204 via the wireless transmission device 207.

Figure 3:
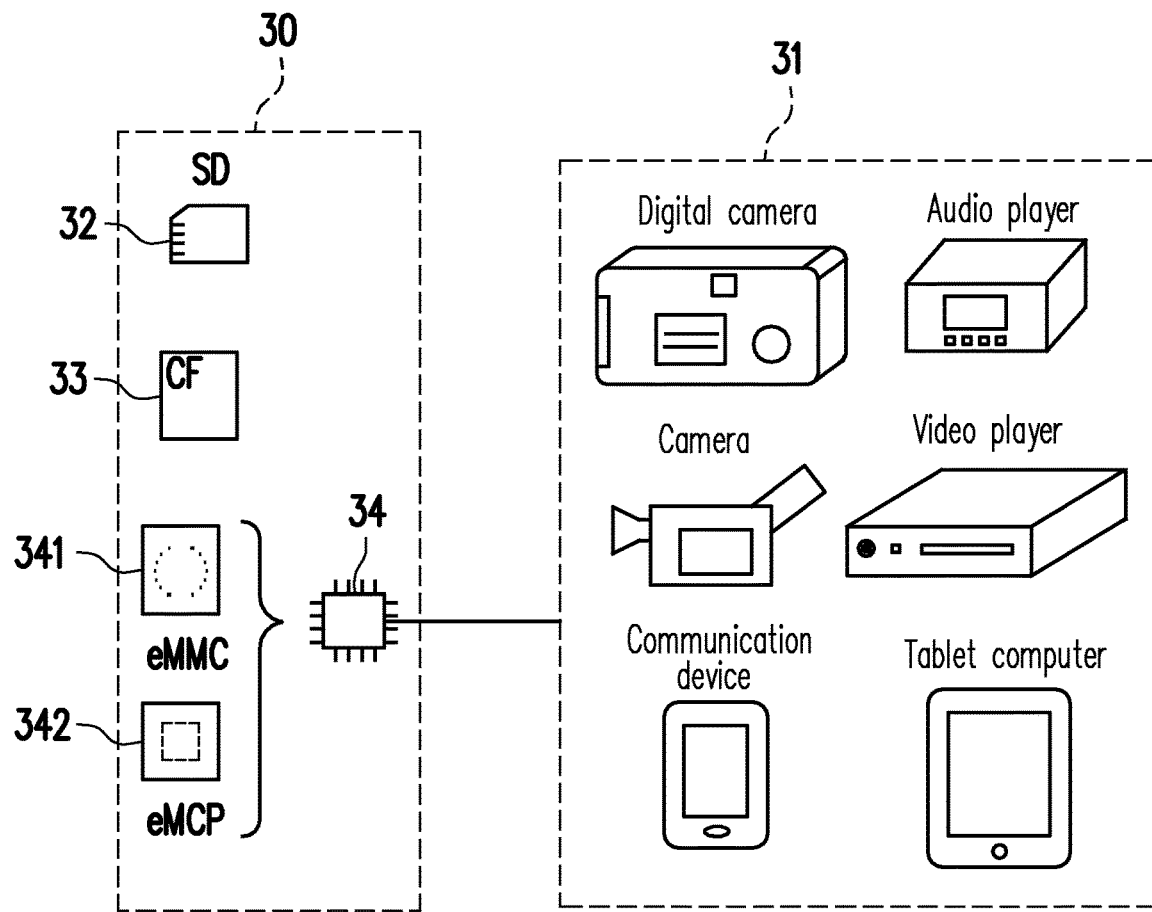
FIG. 3 is a schematic diagram of a host system and a memory storage device according to another exemplary embodiment of the disclosure.

In an exemplary embodiment, the above-mentioned host system is any system that can substantially cooperate with a memory storage device to store data. Although in the above exemplary embodiment, the host system is illustrated by a computer system, FIG. 3 is a schematic diagram of a host system and a memory storage device according to another exemplary embodiment of the disclosure. With reference to FIG. 3, in another exemplary embodiment, a host system 31 may be a system, such as a digital camera, a camera, a communication device, an audio player, a video player, a tablet computer, etc.; and a memory storage device 30 may be various non-volatile memory storage devices, such as a secure digital (SD) card 32, a compact flash (CF) card 33, an embedded storage device 34, etc., used in the host system 31. The embedded storage device 34 includes various embedded storage devices that directly couple a memory module to a substrate of the host system, such as an embedded multimedia card (eMMC) 341 and/or an embedded multi-chip package (eMCP) storage device 342, etc.

Figure 4:
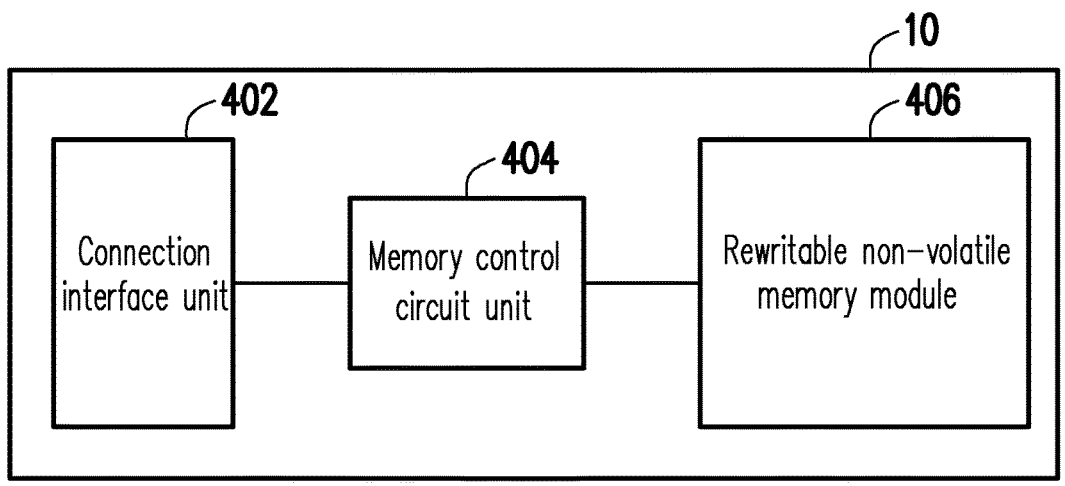
FIG. 4 is a schematic block diagram of a memory storage device according to an exemplary embodiment of the disclosure.

FIG. 4 is a schematic block diagram of a memory storage device according to an exemplary embodiment of the disclosure.

With reference to FIG. 4, the memory storage device 10 includes a connection interface unit 402, a memory control circuit unit 404 (also referred to as a memory control circuit unit for flash memory), and a rewritable non-volatile memory module 406.

The connection interface unit 402 is configured to couple the memory storage device 10 to the host system 11. In the present exemplary embodiment, the connection interface unit 402 complies with the peripheral component interconnect express (PCI Express) standard and is compatible with the non-volatile memory express (NVM express) interface standard. Specifically, the NVM express interface standard is a communication protocol between a host system and a memory device, which defines the register interface, command set and function set between a controller of the memory storage device and an operating system of the host system, and improves the data access speed and data transmission rate of the memory storage device mainly based on the PCIe interface by optimizing the interface standard of the memory storage device. However, in another exemplary embodiment, the connection interface unit 402 may comply with other suitable standards. In addition, the connection interface unit 402 may be packaged in a chip with the memory control circuit unit 404, or the connection interface unit 402 may be disposed outside a chip including the memory control circuit unit 404.

The memory control circuit unit 404 is configured to execute a plurality of logic gates or control commands implemented in a hardware form or a firmware form and to perform operations belongs such as writing, reading and erasing of data in the rewritable non-volatile memory module 406 according to the commands of the host system 11.

The rewritable non-volatile memory module 406 is coupled to the memory control circuit unit 404 and is configured to store data written by the host system 11. The rewritable non-volatile memory module 406 may be a single-level-cell (SLC) NAND flash memory module (i.e., a flash memory module that can store 1 bit in a memory cell), a multi-level-cell (MLC) NAND flash memory module (i.e., a flash memory module that can store 2 bits in a memory cell), a triple-level-cell (TLC) NAND flash memory module (i.e., a flash memory module that can store 3 bits in a memory cell), other flash memory modules, or other memory modules with the same characteristics.

Each memory cell in the rewritable non-volatile memory module 406 stores one or a plurality of bits by a change in a voltage (hereinafter also referred to as a threshold voltage). Specifically, there is a charge trapping layer between a control gate and a channel of each memory cell. By applying a write voltage to the control gate, the amount of electrons in the charge trapping layer can be changed, thereby changing the threshold voltage of the memory cell. This process of changing the threshold voltage of the memory cell is also referred to as "writing data to the memory cell" or "programming the memory cell." As the threshold voltage changes, each memory cell in the rewritable non-volatile memory module 406 has a plurality of storage states. By applying a read voltage, it can be determined which storage state the memory cell belongs to, thereby obtaining the one or plurality of bits stored by the memory cell.

In the present exemplary embodiment, the memory cells of the rewritable non-volatile memory module 406 configure a plurality of physical programming units, and the physical programming units configure a plurality of physical erasing units. Specifically, the memory cells on the same word line form one or a plurality of physical programming units. If each memory cell can store two or more bits, the physical programming units on the same word line may be classified at least as lower physical programming units and upper physical programming units. For example, the least significant bit (LSB) of a memory cell belongs to a lower physical programming unit, and the most significant bit (MSB) of a memory cell belongs to an upper physical programming unit. Generally, in an MLC NAND flash memory, the write speed of the lower physical programming unit is greater than the write speed of the upper physical programming unit, and/or the reliability of the lower physical programming unit is higher than the reliability of the upper physical programming unit.

In the present exemplary embodiment, the physical programming unit is the minimum unit for programming. That is, the physical programming unit is the minimum unit for writing data. The physical programming unit is, for example, a physical page or a physical sector. If the physical programming unit is a physical page, then the physical programming unit typically includes a data bit area and a redundancy bit area. The data bit area includes a plurality of physical sectors configured for storing user data, and the redundancy bit area is configured for storing system data (e.g. management data such as error correction codes). In the present exemplary embodiment, the data bit area includes 32 physical sectors, and the size of a physical sector is 512 bytes (B). However, in other exemplary embodiments, the data bit area may include 8, 16, or a greater or lesser number of physical sectors, and the size of each physical sector may be larger or smaller. Further, a physical erasing unit is the minimum unit for erasing. That is, each physical erasing unit includes the smallest number of memory cells to be erased together. The physical erasing unit is, for example, a physical block.

Figure 5:
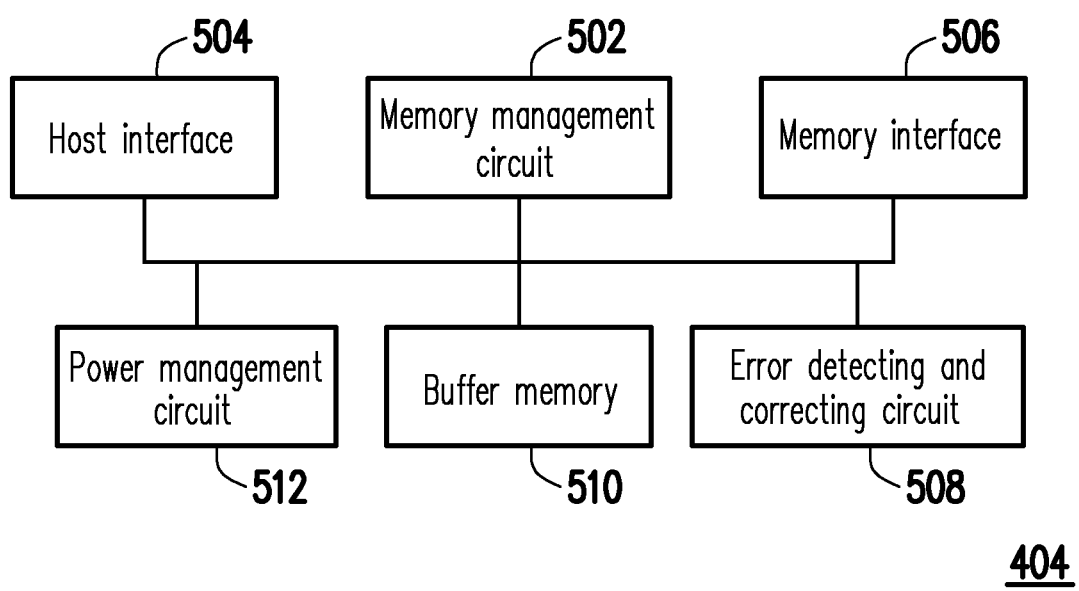
FIG. 5 is a schematic block diagram of a memory control circuit unit according to an exemplary embodiment of the disclosure.

FIG. 5 is a schematic block diagram of a memory control circuit unit according to an exemplary embodiment of the disclosure.

With reference to FIG. 5, the memory control circuit unit 404 includes a memory management circuit 502, a host interface 504, and a memory interface 506.

The memory management circuit 502 is configured to control the overall operation of the memory control circuit unit 404. Specifically, the memory management circuit 502 has a plurality of control commands, and when the memory storage device 10 operates, the plurality of control commands are executed to perform operations such as writing, reading and erasing of data. When the operation of the memory management circuit 502 is described below, it is equivalent to describing the operation of the memory control circuit unit 404.

In the present exemplary embodiment, the control commands of the memory management circuit 502 are implemented in a firmware form. For example, the memory management circuit 502 has a microprocessor unit (not shown) and a read only memory (not shown), and the control commands are programmed into the read only memory. When the memory storage device 10 operates, the control commands are executed by the microprocessor unit to perform operations such as writing, reading, and erasing of data.

Figure 6:
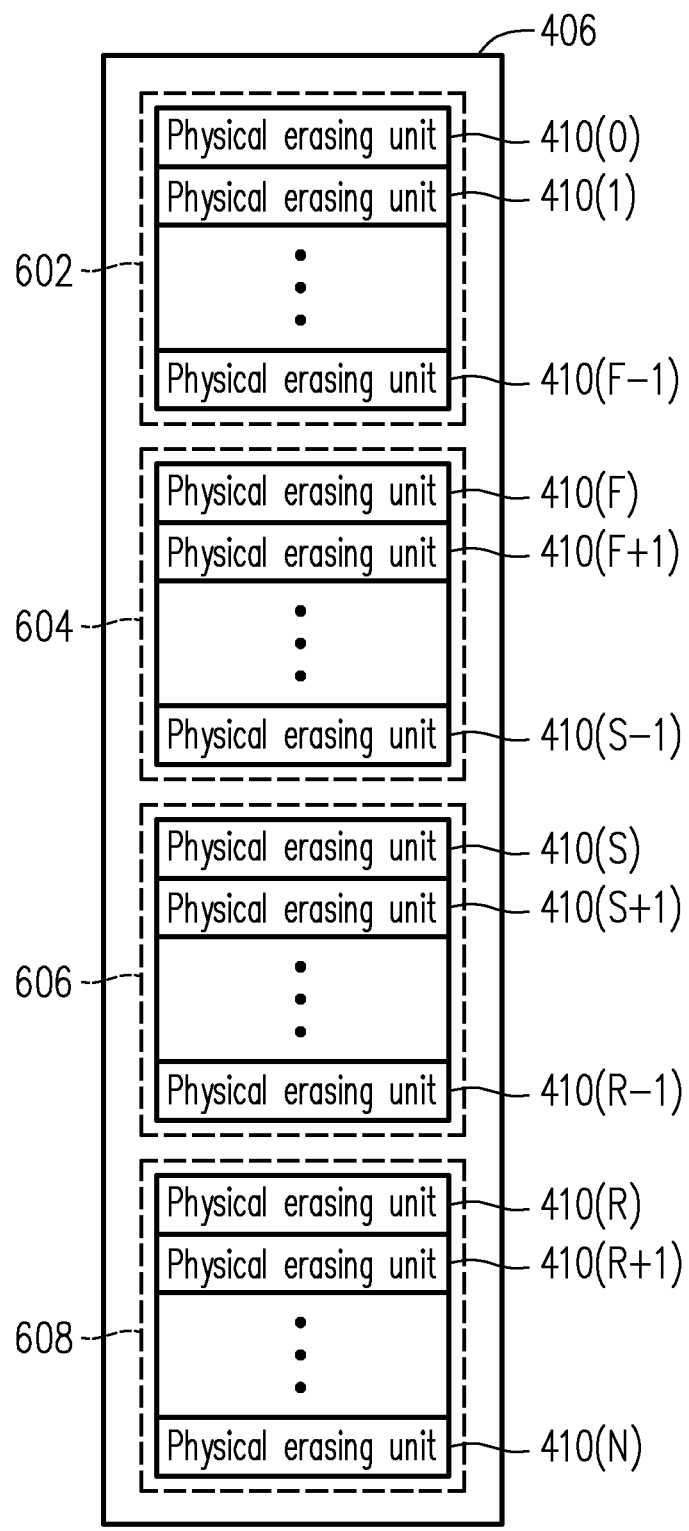
FIG. 6 and FIG. 7 are schematic diagrams of examples of managing physical erasing units according to an exemplary embodiment.
Figure 7:
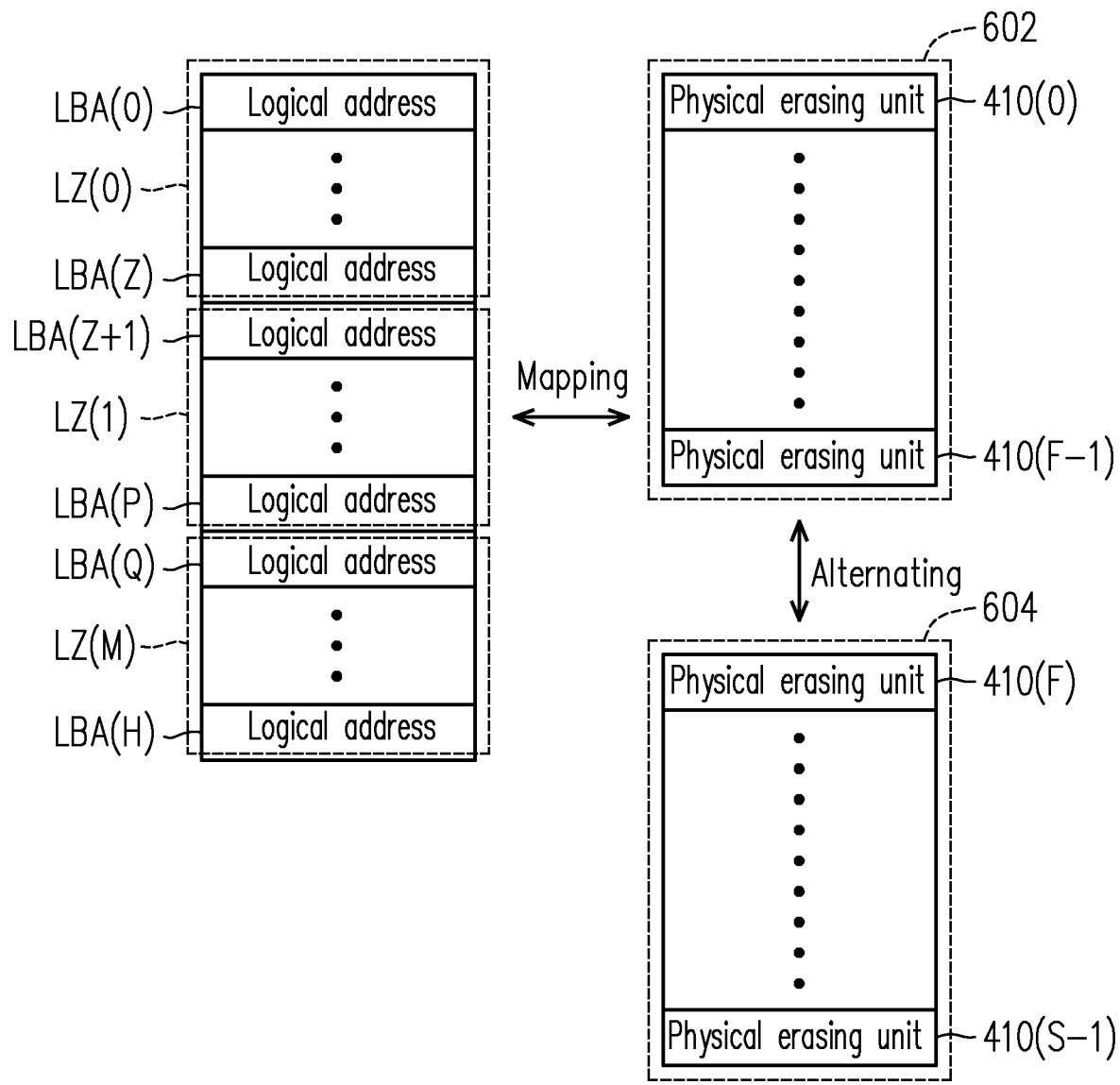

FIG. 6 and FIG. 7 are schematic diagrams of examples of managing physical erasing units according to an exemplary embodiment.

It should be understood that when operations of the physical erasing units of the rewritable non-volatiles memory module 406 are described, terms such as "get", "group", "divide", "associate" and so forth for operating the physical erasing units are logical concepts. That is, the actual positions of the physical erasing units of the rewritable non-volatile memory module do not change; instead, the physical erasing units of the rewritable non-volatile memory module are operated logically.

With reference to FIG. 6, the memory control circuit unit 404 (or the memory management circuit 502) logically groups the physical erasing units 410(0) to 410(N) into a data area 602, an idle area 604, a system area 606 and a replacement area 608.

The physical erasing units logically belonging to the data area 602 and the idle area 604 are configured to store data from the host system 11. Specifically, the physical erasing units of the data area 602 are regarded as physical erasing units stored with data, and the physical erasing units of the idle area 604 are configured for alternating the physical erasing units of the data area 602. That is, when a write command and data to be written are received from the host system 11, the memory management circuit 502 gets the physical erasing units from the idle area 604 and writes the data to the gotten physical erasing units to alternate the physical erasing units in the data area 602.

The physical erasing units logically belonging to the system area 606 are configured to record system data. For example, the system data includes the manufacturer and model of the rewritable non-volatile memory module, the number of physical erasing units of the rewritable non-volatile memory module, the number of physical programming units of each physical erasing unit, etc.

The physical erasing units logically belonging to the replacement area 608 are used for a bad physical erasing unit replacement procedure to replace damaged physical erasing units. Specifically, if there are still normal physical erasing units in the replacement area 608 and the physical erasing units in the data area 602 are damaged, the memory management circuit 502 gets the normal physical erasing units from the replacement area 608 to replace the damaged physical erasing units.

In particular, the number of physical erasing units in the data area 602, the idle area 604, the system area 606, and the replacement area 608 varies with different memory specifications. In addition, it should be understood that in the operation of the memory storage device 10, the grouping relationship of the physical erasing units associated with the data area 602, the idle area 604, the system area 606, and the replacement area 608 changes dynamically. For example, when the physical erasing units in the idle area 604 are damaged and replaced by the physical erasing units in the replacement area 608, the physical erasing units originally in the replacement area 608 are then associated with the idle area 604.

With reference to FIG. 7, the memory control circuit unit 404 (or the memory management circuit 502) configures logical addresses LBA(0) to LBA(H) to map the physical erasing units of the data area 602, wherein each of the logical addresses has a plurality of logical units to map the physical programming units of the corresponding physical erasing units. In addition, when the host system 11 is to write data to the logical address or to update the data stored in the logical address, the memory control circuit unit 404 (or the memory management circuit 502) gets a physical erasing unit from the idle area 604 as the active physical erasing unit to write data, so as to alternate the physical erasing units in the data area 602. In addition, when the physical erasing unit as the active physical erasing unit is fully written, the memory control circuit unit 404 (or the memory management circuit 502) gets empty physical erasing units from the idle area 604 as active physical erasing units to continue writing the updated data corresponding to the write command from the host system 11. Furthermore, when the number of the physical erasing units available in the idle area 604 is smaller than a predetermined value, the memory control circuit unit 404 (or the memory management circuit 502) executes a VDMO (also referred to as a garbage collection operation) to organize valid data in the data area 602, so as to re-associate the physical erasing units not stored with the valid data in the data area 602 to the idle area 604.

To identify in which physical erasing units the data of each logical address is stored, in the present exemplary embodiment, the memory control circuit unit 404 (or the memory management circuit 502) records the mapping between the logical addresses and the physical erasing units. For example, in the present exemplary embodiment, the memory control circuit unit 404 (or the memory management circuit 502) stores a logical address-physical address mapping table in the rewritable non-volatile memory module 406 to record the physical erasing unit mapped to each logical address. When data is to be accessed, the memory control circuit unit 404 (or the memory management circuit 502) loads the logical address-physical address mapping table to a buffer memory 510 for maintenance, and writes or reads data according to the logical address-physical address mapping table.

It should be mentioned that, due to limited capacity, the buffer memory 510 is unable to store the mapping table recording the mapping relations of all logical addresses. Therefore, in the present exemplary embodiment, the memory control circuit unit 404 (or the memory management circuit 502) groups the logical addresses LBA(0) to LBA(H) into a plurality of logical zones LZ(0) to LZ(M), and allocates one logical address-physical address mapping table to each logical zone. Particularly, when the memory control circuit unit 404 (or the memory management circuit 502) is to update the mapping of a certain logical address, the logical address-physical address mapping table corresponding to the logical zone of this logical address is loaded to the buffer memory 510 to be updated.

In another exemplary embodiment, the control commands of the memory management circuit 502 may be stored in a specific area of the rewritable non-volatile memory module 406 (e.g. a system area dedicated to storing system data in the memory module) in a program code form. In addition, the memory management circuit 502 has a microprocessor unit (not shown), a read only memory (not shown), and a random access memory (not shown). In particular, the read only memory has a boot code, and when the memory control circuit unit 404 is enabled, the microprocessor unit first executes the boot code to load the control commands stored in the rewritable non-volatile memory module 406 into the random access memory of the memory management circuit 502. Thereafter, the microprocessor unit runs these control commands to perform operations such as writing, reading and erasing of data.

In addition, in another exemplary embodiment, the control commands of the memory management circuit 502 may be implemented in a hardware form. For example, the memory management circuit 502 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage the memory cells of the rewritable non-volatile memory module 406 or a group thereof. The memory writing circuit is configured to issue a write command sequence to the rewritable non-volatile memory module 406 to write data into the rewritable non-volatile memory module 406. The memory reading circuit is configured to issue a read command sequence to the rewritable non-volatile memory module 406 to read data from the rewritable non-volatile memory module 406. The memory erasing circuit is configured to issue an erase command sequence to the rewritable non-volatile memory module 406 to erase data from the rewritable non-volatile memory module 406. The data processing circuit is configured to process the data to be written to the rewritable non-volatile memory module 406 and the data read from the rewritable non-volatile memory module 406. The write command sequence, the read command sequence, and the erase command sequence may each include one or a plurality of program codes or command codes for instructing the rewritable non-volatile memory module 406 to perform corresponding operations of writing, reading and erasing. In an exemplary embodiment, the memory management circuit 502 may issue other types of command sequences to the rewritable non-volatile memory module 406 to instruct the rewritable non-volatile memory module 406 to perform corresponding operations.

With reference to FIG. 5 again, the host interface 504 is coupled to the memory management circuit 502 and is configured to receive and identify the commands and data transmitted from the host system 11. In other words, the commands and data transmitted from the host system 11 are transmitted to the memory management circuit 502 via the host interface 504. In the present exemplary embodiment, the host interface 504 is compatible with the PCI Express standard. However, it should be understood that the disclosure is not limited thereto, and the host interface 504 may be compatible with the PATA standard, the IEEE 1394 standard, the SATA standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 506 is coupled to the memory management circuit 502 and is configured to access the rewritable non-volatile memory module 406. In other words, the data to be written to the rewritable non-volatile memory module 406 is converted to a format acceptable to the rewritable non-volatile memory module 406 via the memory interface 506. Specifically, if the memory management circuit 502 is to access the rewritable non-volatile memory module 406, the memory interface 506 transmits a corresponding command sequence. For example, the command sequences may include a write command sequence to instruct data writing, a read command sequence to instruct data reading, an erase command sequence to instruct data erasing, and corresponding command sequences for instructing various memory operations (e.g. changing the read voltage level, executing a garbage collection operation, etc.). These command sequences are, for example, generated by the memory management circuit 502 and transmitted to the rewritable non-volatile memory module 406 via the memory interface 506. The command sequences may include one or a plurality signals or data on the bus. The signals or data may include command codes or program codes. For example, the read command sequence includes information such as a read identification code, a memory address, etc.

In an exemplary embodiment, the memory control circuit unit 404 further includes an error detecting and correcting circuit 508, a buffer memory 510 and a power management circuit 512.

The error detecting and correcting circuit 508 is coupled to the memory management circuit 502 and is configured to perform an error detecting and correcting operation to ensure the correctness of the data. Specifically, when the memory management circuit 502 receives a write command from the host system 11, the error detecting and correcting circuit 508 generates a corresponding error correcting code (ECC) and/or error detecting code (EDC) for the data corresponding to the write command, and the memory management circuit 502 writes the data corresponding to the write command and the corresponding error correcting code and/or error detecting code to the rewritable non-volatile memory module 406. Thereafter, when the memory management circuit 502 reads the data from the rewritable non-volatile memory module 406, it reads the error correcting code and/or the error detecting code corresponding to the data simultaneously, and the error detecting and correcting circuit 508 performs the error detecting and correcting operation on the read data based on the error correcting code and/or error detecting code.

The buffer memory 510 is coupled to the memory management circuit 502 and is configured to temporarily store data and commands from the host system 11 or data from the rewritable non-volatile memory module 406. The power management circuit 512 is coupled to the memory management circuit 502 and is configured to control the power of the memory storage device 10.

It is noted that in the following description, some terms may be replaced with corresponding abbreviations for ease of reading (see Table 1).

TABLE 1

| rewritable non-volatile memory module | RNVM module |
|---|---|
| physical erasing unit | PEU |
| memory management circuit | MMC |
| valid data merging operation | VDMO |

Figure 8A:
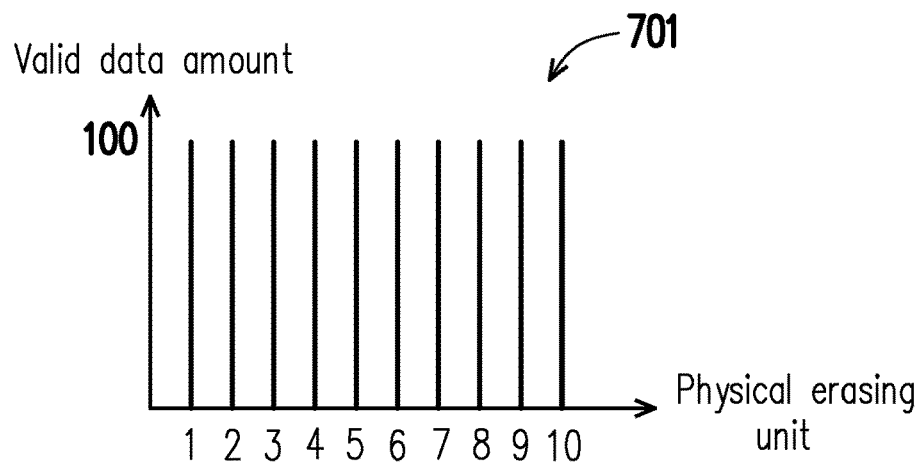
FIG. 8A and FIG. 8B are statistical charts of the distribution of valid data and the change amount of valid data according to an exemplary embodiment.
Figure 8A:
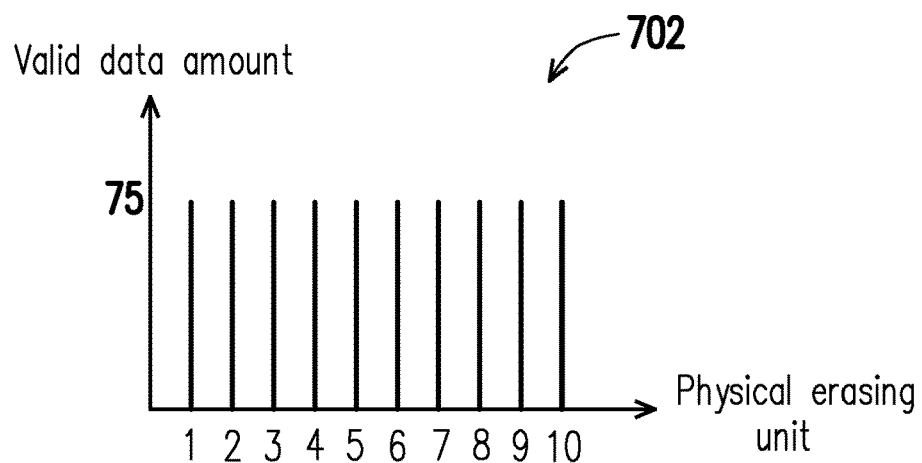
Figure 8A:
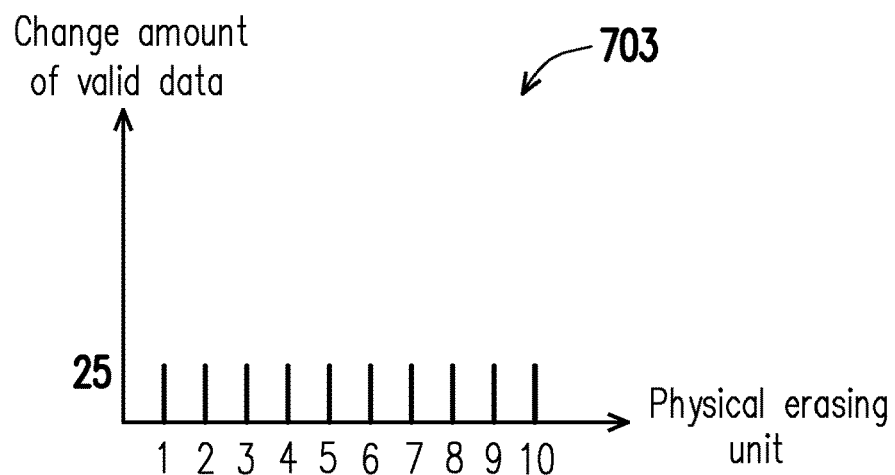
Figure 8B:
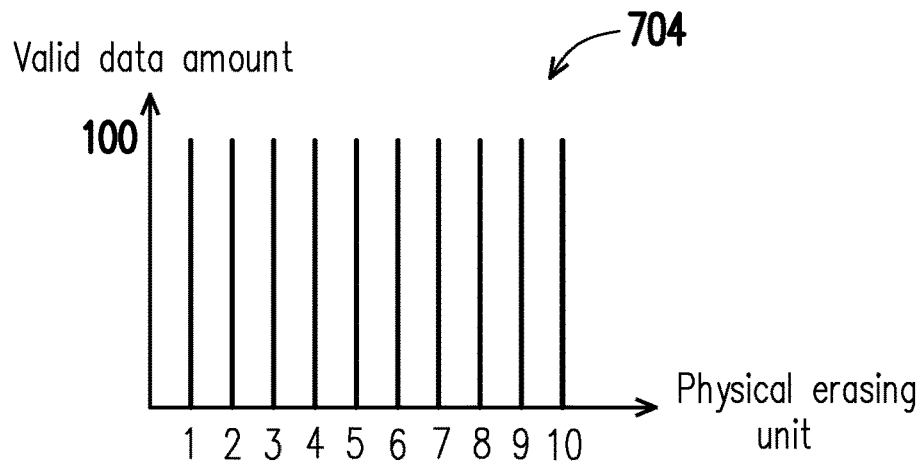
Figure 8B:
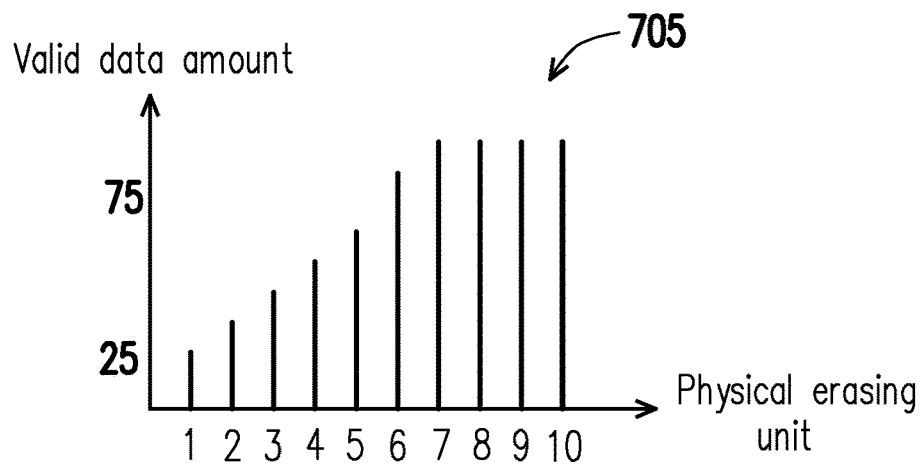
Figure 8B:
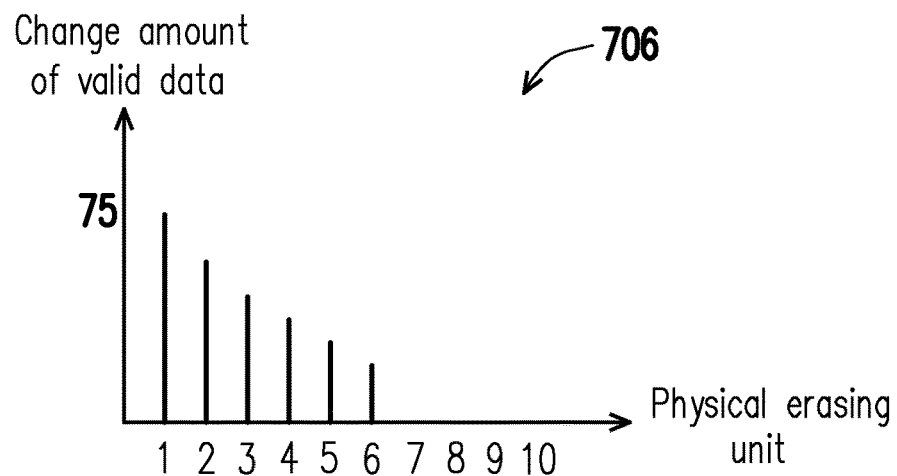

FIG. 8A and FIG. 8B are statistical charts of the distribution of valid data and the change amount of valid data according to an exemplary embodiment.

With reference to FIG. 8A, as shown in the statistical chart 701, it is assumed that in the initial state, the RNVM module 406 has 10 PEUs, and that the valid data amount of these PEUs is 100% of the capacity of one PEU. After the MMC 502 writes at least one piece of data to at least one PEU in the idle area 604, it is assumed that the valid data amount of the aforementioned 10 PEUs has become 75% of the capacity of one PEU, as shown in the statistical chart 702. The statistical chart 703 shows the change amount of the valid data amount of each of the 10 PEUs, and this change amount can be used to observe the distribution state of the valid data in the PEUs. As shown in the statistical chart 703, it shows that after the data is written to at least one PEU in the idle area 604, the valid data amount of each PEU decreases by 25% of the capacity of one PEU. In other words, after the data is written to at least one PEU in the idle area 604, the number of PEUs whose valid data amount has changed is relatively large (i.e., 10), and the degree of change of the valid data amount is relatively average.

As shown in the statistical chart 703, the valid data is evenly dispersed in the aforementioned 10 PEUs (i.e., the distribution state of the valid data is relatively dispersive). In particular, in the case where the distribution state of the valid data is relatively dispersive, a larger number of source PEUs (e.g., 4 source PEUs) are required to perform the VDMO to add one PEU to the idle area 604, which results in a poor efficiency of the VDMO. At this time, if the MMC 502 raises a specific threshold value, more PEUs can be reserved in the idle area 604 when the VDMO is started. In this way, when the VDMO and the write operation of the host system 11 are alternately performed, the data of the host system 11 can be written into the PEUs of the idle area 604 to avoid the case where there are not sufficient PEUs in the idle area 604 for additional writing, thereby improving the write performance of the host system 11.

In another example, with reference to FIG. 8B, as shown in the statistical chart 704, it is assumed that in the initial state, the RNVM module 406 has 10 PEUs, and that the valid data amount of these PEUs is 100% of the capacity of one PEU. After the MMC 502 writes at least one piece of data to at least one PEU in the idle area 604, it is assumed that the valid data amount of the aforementioned 10 PEUs has become as shown in the statistical chart 705. The statistical chart 706 shows the change amount of the valid data amount of each of the 10 PEUs, and this change amount can be used to observe the distribution state of the valid data in the PEUs. As shown in the statistical chart 706, it shows that after the data is written to at least one PEU in the idle area 604, the change in the valid data amount is concentrated in the first to sixth PEUs. In this case, the distribution state of the valid data in the RNVM module 406 is less dispersive (i.e., more concentrated). In particular, in the case where the distribution state of the valid data is less dispersive, a smaller number of source PEUs (e.g., 2 source PEUs) may be used to perform the VDMO to add one PEU to the idle area 604, which results in a better efficiency of the VDMO. At this time, the MMC 502 can lower (or maintain) the specific threshold value. If the MMC 502 lowers the specific threshold value, the VDMO may be started later to allow the host system 11 to perform more writes, thereby improving the write performance of the host system 11. In addition, since the valid data is more concentrated, fewer source PEUs may be used to increase the number of the PEUs in the idle area 604, which can also improve the execution performance of the VDMO.

Figure 9:
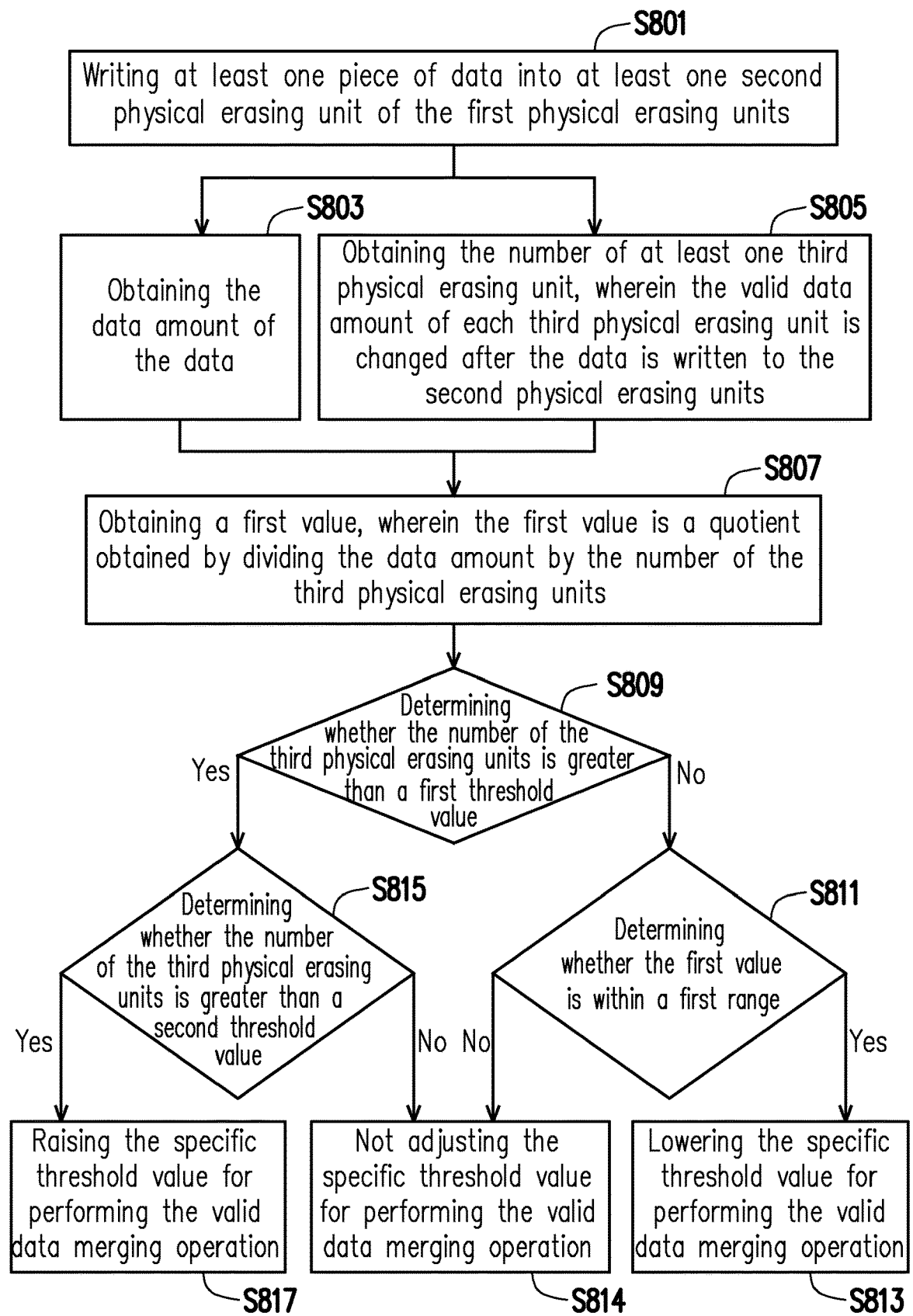
FIG. 9 is a flowchart of a method for adjusting the specific threshold value for performing the VDMO according to an exemplary embodiment.

FIG. 9 is a flowchart of a method for adjusting the specific threshold value for performing the VDMO according to an exemplary embodiment. In the example of FIG. 9, the MMC 502 obtains the distribution state of the valid data in the PEUs of the RNVM module 406 and adjusts the specific threshold value for performing the VDMO according to the distribution state.

In more detail, with reference to FIG. 9. first, in step S801, the MMC 502 writes at least one piece of data to at least one PEU (also referred to as second PEUs) of the PEUs (also referred to as first PEUs) in the idle area 604. In particular, in an embodiment, the MMC 502 starts performing the operation of the above step S801 to obtain the distribution state of the valid data in the first PEUs only when the data amount of the above-mentioned written data is equal to a specific data amount (e.g., the data amount that can be stored by 10 PEUs).

Next, in step S803, the MMC 502 obtains the data amount of the above-mentioned written data. In step S805, the MMC 502 obtains the number of at least one PEU (also referred to as third PEUs) in the RNVM module 406. In particular, after the above-mentioned data is written into the second PEUs, the valid data amount of each third PEU is thus changed. In other words, the third PEUs represent PEUs whose valid data amount has changed after the write operation in the above step S801 is performed. These third PEUs may be located in the data area 602 or other areas, which is not limited herein.

Thereafter, the MMC 502 adjusts the specific threshold value according to the above-mentioned data amount and the number of the third PEUs. In more detail, in step S807, the MMC 502 obtains a first value, and the first value is a quotient obtained by dividing the above-mentioned data amount by the number of the third PEUs. The first value represents the average decreased valid data amount in one PEU. Thereafter, in step S809, the MMC 502 determines whether the number of the third PEUs is greater than a first threshold value. The first threshold value is, for example, 10% of the number of the PEUs in the idle area before step S801 is performed (i.e., 10% of the number of the first PEUs); however, the disclosure does not limit the first threshold value to the above. When the number of the third PEUs is not greater than the first threshold value, in step S811, the MMC 502 further determines whether the first value is within a first range. In the present embodiment, the MMC 502 further determines whether the first value is between a minimum value (e.g., 80%) and a maximum value (e.g., 120%); however, the disclosure does not limit the first range to the above.

When the first value is within the first range, in step S813, the MMC 502 lowers the specific threshold value for performing the VDMO. The disclosure does not limit by what amount the specific threshold value has to be lowered. For example, it is assumed that the specific threshold value is set to 5 in the initial situation of FIG. 9, and in step S813, the minimum value to which the specific threshold value can be adjusted by the MMC 502 is 3 (that is, at most 2 is subtracted from the specific threshold value). In particular, when the number of the third PEUs is less than the first threshold value and the first value is within the first range, it means that the distribution state of the valid data in the RNVM module 406 is less dispersive (i.e., more concentrated), and lowering the specific threshold value allows the VDMO to be started later so as to allow the host system 11 to perform more writes, thereby improving the write performance of the host system 11. In addition, since the valid data is more concentrated, fewer source PEUs may be used to increase the number of the PEUs in the idle area 604, which can also improve the execution performance of the VDMO.

However, when the first value is not within the first range, in step S814, the MMC 502 does not adjust the specific threshold value for performing the VDMO.

When the number of the third PEUs is greater than the first threshold value, in step S815, the MMC 502 determines whether the number of the third PEUs is greater than a second threshold value. The second threshold value is, for example, 30% of the number of the PEUs in the idle area before step S801 is performed (i.e., 30% of the number of the first PEUs); however, the disclosure does not limit the second threshold value to the above.

When the number of the third PEUs is not greater than the second threshold value, in step S814, the MMC 502 does not adjust the specific threshold value for performing the VDMO. When the number of the third PEUs is greater than the second threshold value, in step S817, the MMC 502 raises the specific threshold value for performing the VDMO. The disclosure does not limit by what amount the specific threshold value has to be raised. For example, it is assumed that the specific threshold value is set to 5 in the initial situation of FIG. 9, and in step S817, the maximum value to which the specific threshold value can be adjusted by the MMC 502 is 8 (that is, at most 3 is added to the specific threshold value). In particular, when the number of the third PEUs is greater than the second threshold value, it means that the distribution state of the valid data in the RNVM module 406 is more dispersive, and raising the specific threshold value allows more PEUs to be reserved in the idle area when the VDMO is started. In this way, when the VDMO and the write operation of the host system 11 are alternately performed, the data of the host system 11 can be written into the PEUs of the idle area to avoid the case where there are not sufficient PEUs in the idle area 604 for additional writing, thereby improving the write performance of the host system 11.

After that, when the number of the PEUs in the idle area (i.e., the number of the first PEUs) is less than the specific threshold value, the MMC 502 performs the VDMO.

It should be noted here that although the example in FIG. 9 performs step S809 before performing step S815, in other embodiments, step S815 may be performed before step S809 is performed.

Figure 10:
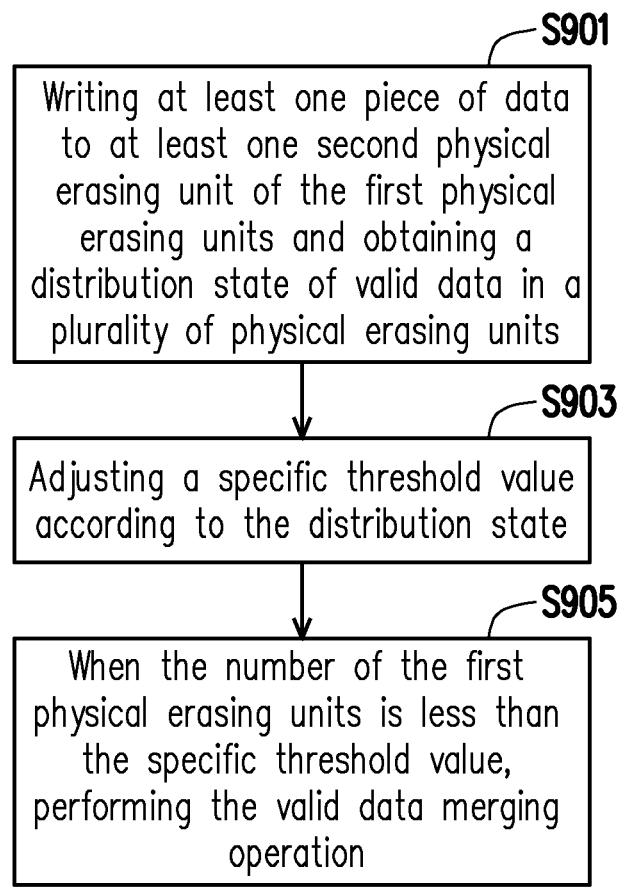
FIG. 10 is a flowchart of a data arranging method according to an exemplary embodiment.

FIG. 10 is a flowchart of a data arranging method according to an exemplary embodiment.

With reference to FIG. 10, in step S901, the MMC 502 writes at least one piece of data to at least one second PEU of the first PEUs and obtains a distribution state of valid data in a plurality of PEUs. In step S903, the MMC 502 adjusts a specific threshold value according to the distribution state. When the number of the first PEUs is less than the specific threshold value, in step S905, the MMC 502 performs the VDMO.

In summary, the data arranging method, the memory control circuit unit, and the memory storage device for flash memory of the disclosure can dynamically adjust the specific threshold value for determining whether to perform the VDMO according to the distribution state of the valid data in the RNVM module, thereby preventing the VDMO from affecting the write performance of the host system to the RNVM module and thereby improving the performance of the VDMO.

What is claimed is:

1. A data arranging method for flash memory, configured for a rewritable non-volatile memory module, wherein the rewritable non-volatile memory module has a plurality of physical erasing units, the rewritable non-volatile memory module comprises an idle area, and at least one first physical erasing unit of the plurality of physical erasing units is associated with the idle area, the data arranging method comprising:
    writing at least one piece of data into at least one second physical erasing unit of the first physical erasing unit;
    obtaining a distribution state of valid data in the plurality of physical erasing units;
    adjusting a specific threshold value according to the distribution state; and
    performing a valid data merging operation if the number of the first physical erasing unit is less than the specific threshold value,
    wherein the obtaining the distribution state of the valid data in the plurality of physical erasing units comprises:
    obtaining a data amount of the data; and
    obtaining the number of at least one third physical erasing unit of the plurality of physical erasing units, wherein a valid data amount of each third physical erasing unit is changed after the data is written to the second physical erasing unit.

2. The data arranging method for flash memory according to claim 1, wherein the adjusting the specific threshold value according to the distribution state comprises:
    adjusting the specific threshold value according to the data amount and the number of the third physical erasing unit.

3. The data arranging method for flash memory according to claim 2, wherein the adjusting the specific threshold value according to the data amount and the number of the third physical erasing unit comprises:
    obtaining a first value, wherein the first value is a quotient obtained by dividing the data amount by the number of the third physical erasing unit; and
    lowering the specific threshold value if the number of the third physical erasing unit is not greater than a first threshold value and the first value is within a first range.

4. The data arranging method for flash memory according to claim 3, wherein the adjusting the specific threshold value according to the data amount and the number of the third physical erasing unit comprises:
    raising the specific threshold value if the number of the third physical erasing unit is greater than a second threshold value.

5. The data arranging method for flash memory according to claim 4, wherein the first threshold value is 10% of the number of the first physical erasing unit, and the second threshold value is 30% of the number of the first physical erasing unit.

6. The data arranging method for flash memory according to claim 1, wherein the obtaining the distribution state of the valid data in the plurality of physical erasing units is performed only when a data amount of the data is equal to a specific data amount.

7. A memory control circuit unit for flash memory, configured to control a rewritable non-volatile memory module, the memory control circuit unit comprising:
    a host interface configured to be coupled to a host system;
    a memory interface configured to be coupled to the rewritable non-volatile memory module, wherein the rewritable non-volatile memory module has a plurality of physical erasing units, the rewritable non-volatile memory module comprises an idle area, and at least one first physical erasing unit of the plurality of physical erasing units is associated with the idle area; and
    a memory management circuit coupled to the host interface and the memory interface,
    wherein the memory management circuit is configured to write at least one piece of data into at least one second physical erasing unit of the first physical erasing unit,
    wherein the memory management circuit is further configured to obtain a distribution state of valid data in the plurality of physical erasing units,
    wherein the memory management circuit is further configured to adjust a specific threshold value according to the distribution state, and
    if the number of the first physical erasing unit is less than the specific threshold value, the memory management circuit is further configured to perform a valid data merging operation,
    wherein in an operation to obtain the distribution state of the valid data in the plurality of physical erasing units,
    the memory management circuit is further configured to obtain a data amount of the data, and
    the memory management circuit is further configured to obtain the number of at least one third physical erasing unit of the plurality of physical erasing units, wherein a valid data amount of each third physical erasing unit is changed after the data is written to the second physical erasing unit.

8. The memory control circuit unit for flash memory according to claim 7, wherein in an operation to adjust the specific threshold value according to the distribution state,
    the memory management circuit is further configured to adjust the specific threshold value according to the data amount and the number of the third physical erasing unit.

9. The memory control circuit unit for flash memory according to claim 8, wherein in an operation to adjust the specific threshold value according to the data amount and the number of the third physical erasing unit, the memory management circuit is further configured to obtain a first value, wherein the first value is a quotient obtained by dividing the data amount by the number of the third physical erasing unit, and if the number of the third physical erasing unit is not greater than a first threshold value and the first value is within a first range, the memory management circuit is further configured to lower the specific threshold value.

10. The memory control circuit unit for flash memory according to claim 9, wherein in the operation to adjust the specific threshold value according to the data amount and the number of the third physical erasing unit, if the number of the third physical erasing unit is greater than a second threshold value, the memory management circuit is further configured to raise the specific threshold value.

11. The memory control circuit unit for flash memory according to claim 10, wherein the first threshold value is 10% of the number of the first physical erasing unit, and the second threshold value is 30% of the number of the first physical erasing unit.

12. The memory control circuit unit for flash memory according to claim 7, wherein the memory management circuit performs an operation to obtain the distribution state of the valid data in the plurality of physical erasing units only when a data amount of the data is equal to a specific data amount.

13. A memory storage device for flash memory, comprising:

a connection interface unit configured to be coupled to a host system;

a rewritable non-volatile memory module, wherein the rewritable non-volatile memory module has a plurality of physical erasing units, the rewritable non-volatile memory module comprises an idle area, and at least one first physical erasing unit of the plurality of physical erasing units is associated with the idle area; and a memory control circuit unit coupled to the connection interface unit and the rewritable non-volatile memory module, wherein the memory control circuit unit is configured to write at least one piece of data into at least one second physical erasing unit of the first physical erasing unit, wherein the memory control circuit unit is further configured to obtain a distribution state of valid data in the plurality of physical erasing units, wherein the memory control circuit unit is further configured to adjust a specific threshold value according to the distribution state, and if the number of the first physical erasing unit is less than the specific threshold value, the memory control circuit unit is further configured to perform a valid data merging operation, wherein in an operation to obtain the distribution state of the valid data in the plurality of physical erasing units, the memory control circuit unit is further configured to obtain a data amount of the data, and the memory control circuit unit is further configured to obtain the number of at least one third physical erasing unit of the plurality of physical erasing units, wherein a valid data amount of each third physical erasing unit is changed after the data is written to the second physical erasing unit.

14. The memory storage device for flash memory according to claim 13, wherein in an operation to adjust the specific threshold value according to the distribution state, the memory control circuit unit is further configured to adjust the specific threshold value according to the data amount and the number of the third physical erasing unit.

15. The memory storage device for flash memory according to claim 14, wherein in an operation to adjust the specific threshold value according to the data amount and the number of the third physical erasing unit, the memory control circuit unit is further configured to obtain a first value, wherein the first value is a quotient obtained by dividing the data amount by the number of the third physical erasing unit, and if the number of the third physical erasing unit is not greater than a first threshold value and the first value is within a first range, the memory control circuit unit is further configured to lower the specific threshold value.

16. The memory storage device for flash memory according to claim 15, wherein in the operation to adjust the specific threshold value according to the data amount and the number of the third physical erasing unit, if the number of the third physical erasing unit is greater than a second threshold value, the memory control circuit unit is further configured to raise the specific threshold value.

17. The memory storage device for flash memory according to claim 16, wherein the first threshold value is 10% of the number of the first physical erasing unit, and the second threshold value is 30% of the number of the first physical erasing unit.

18. The memory storage device for flash memory according to claim 13, wherein the memory control circuit unit performs an operation to obtain the distribution state of the valid data in the plurality of physical erasing units only when a data amount of the data is equal to a specific data amount.

* * * * *